April 7, 1970 P. S. GLEIM 3,505,107

VAPOR DEPOSITION OF GERMANIUM SEMICONDUCTOR MATERIAL

Filed Jan. 3, 1966 3 Sheets-Sheet 1

INVENTOR
Paul S. Gleim

BY John D. Graham
ATTORNEY

April 7, 1970 P. S. GLEIM 3,505,107

VAPOR DEPOSITION OF GERMANIUM SEMICONDUCTOR MATERIAL

Filed Jan. 3, 1966 3 Sheets-Sheet 2

INVENTOR
Paul S. Gleim

BY John D. Edham

ATTORNEY

VAPOR DEPOSITION OF GERMANIUM SEMICONDUCTOR MATERIAL

Filed Jan. 3, 1966 3 Sheets-Sheet 3

INVENTOR
Paul S. Gleim

BY John D. Upham
ATTORNEY

United States Patent Office 3,505,107

Patented Apr. 7, 1970

3,505,107

VAPOR DEPOSITION OF GERMANIUM SEMICONDUCTOR MATERIAL

Paul S. Gleim, Dallas, Tex., assignor to Texas Instruments Incorporated, Dallas, Tex., a corporation of Delaware Filed Jan. 3, 1966, Ser. No. 518,412
Int. Cl. B44d *1/18;* H01l *15/00*
U.S. Cl. 117—212 6 Claims

ABSTRACT OF THE DISCLOSURE

A method of depositing germanium semiconductor material upon a dissimilar material is disclosed. More specifically, a slurry containing germanium particles is applied to a substrate such as glass and evaporated to leave a coating of randomly distributed germanium particles on the substrate. Polycrystalline germanium semiconductor material is then formed over the germanium particles and the substrate by vapor deposition techniques, the particles acting as nucleating sites for the deposition.

This invention pertains to vapor deposition of germanium semiconductor material, and more particularly to the vapor deposition of polycrystalline germanium semiconductor material upon a substrate of dissimilar material.

Within the semiconductor field, there are various processes that require the vapor deposition of semiconductor material upon substrates of like material or alternatively, upon substrates of dissimilar material. An example of the latter type occurs within the area of integrated circuits where the fabrication of many active and/or passive circuit components within a single semiconductor wafer requires the electrical isolation of these components from one another. In response to this requirement, an isolation technique has been developed, often referred to as "dielectric isolation," whereby mesas are initially formed upon one face of a monocrystalline semiconductor wafer, an insulating coating, usually silicon oxide, thereafter formed over the mesas, and a thick layer of polycrystalline semiconductor material vapor-deposited over the insulating coating. Subsequently, excess material of the monocrystalline wafer is removed, leaving only the mesas supported by the deposited polycrystalline layer, but insulated therefrom and from one another by the insulating coating. Circuit components are then formed in the monocrystalline material of the individual mesas by conventional techniques, these circuit components thereby being electrically isolated from one another. This process is completely described in copending patent application, Ser. No. 435,633, filed Feb. 26, 1965, and assigned to the assignee of the present invention.

When the monocrystalline semiconductor material is germanium, it is desirable to also have the polycrystalline layer of germanium. This is due, in part, to the desire to have the semiconductor material on each side of the insulating coating be of substantially the same thermal coefficient of expansion, as well as to utilize the same reactor and reactor components throughout the network fabrication since the device fabrication within the individual mesas often requires epitaxial deposition of germanium material.

There are, however, difficulties associated with the vapor deposition of the germanium polycrystalline semiconductor layer upon a substrate of dissimilar material (such as the silicon oxide insulating coating). First, particularly at high temperatures it is difficult, if not impossible to achieve nucleation of the germanium on the dissimilar substrate; second, nucleation, if it occurs at all, does so at scattered sites on the substrate and results in non-uniform growth of the polycrystalline layer.

Besides the area of "dielectric isolation," the fabrication of microcircuits often necessitates discrete regions of polycrystalline semiconductor material being selectively located upon an insulating substrate. For example, resistors for microcircuits can be made by vapor depositing doped polycrystalline semiconductor material on a ceramic substrate.

It is therefore a primary object of this invention to provide a method for vapor depositing germanium semiconductor material upon a surface of a dissimilar material. By dissimilar material is meant any material other than germanium semiconductor material.

It is another object of the invention to enable the uniform deposition of a germanium polycrystalline layer upon an insulating coating in the fabrication of electrically isolated circuit components of an integrated circuit.

It is a further object of the invention to provide vapor deposited regions of polycrystalline germanium semiconductor material at selected locations upon a substrate of dissimilar material.

In accordance with these and other objects, features, and improvements, the present invention constitutes a method for depositing polycrystalline germanium semiconductor material upon a substrate of dissimilar material by first applying a coating of germanium particles to the surface of the substrate to act as nucleating sites for the subsequent vapor deposition of germanium polycrystalline material. In one embodiment of the invention, the coating is applied uniformly over a silicon oxide coating which forms the insulating layer of an integrated circuit, and a uniform germanium polycrystalline layer is thereafter vapor deposited upon the coated oxide. In another embodiment, resistors are formed at selected locations upon an insulating substrate by vapor depositing doped germanium polycrystalline semiconductor material upon the particle-coated substrate.

The novel features believed characteristic of the invention are set forth in the appended claims. The invention itself, however, as well as other objects and advantages thereof, may best be understood by reference to the following detailed description when read in conjunction with the accompanying drawings, in which:

Figure 1:
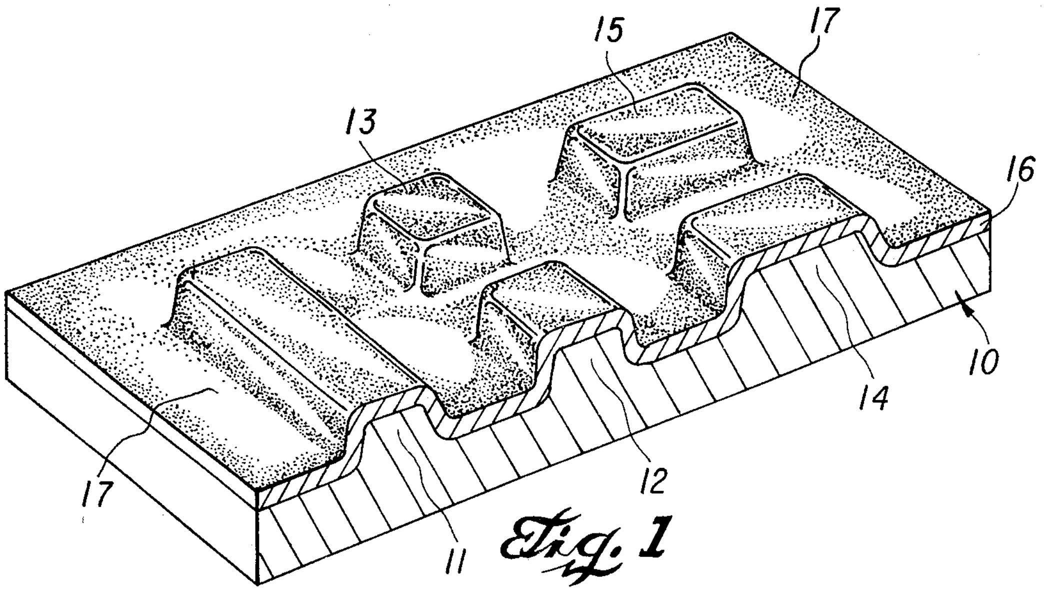
FIGURE 1 is a pictorial view in section of a semiconductor wafer in an early stage of the production of a germanium integrated circuit in accordance with the process of this invention.

Referring now to FIGURE 1, there is described the fabrication of a germanium integrated circuit utilizing the vapor deposition technique of the invention. A slice of single crystal germanium semiconductor material, is used as the starting material. This slice may be about one inch in diameter and 10 mils thick. A small segment of the slice may be represented as a chip or a wafer 10 which represents the segment occupied by one integrated circuit. Actually, the slice would contain dozens or even hundreds of the segments such as the wafer 10. The top surface of the slice is first masked and etched to form a pattern of raised mesas 11 to 15. The masking may be by material such as wax, or preferably by the photoresist techniques which permit excellent geometry control. The height of the mesas 11 to 15, or in other words, depth of the etching, may be about two mils. At this point the top of the germanium slice is covered with insulating coating 16, silicon oxide in this example, which may be formed by any conventional technique to a thickness of perhaps 5,000 A.

A slurry of finely divided germanium particles 17 is then uniformly applied to the exposed surface of the silicon oxide coating 16, the germanium particles providing nucleating sites for the subsequent vapor deposition of a polycrystalline germanium layer. The application of the germanium particles may be applied by various techniques, for example by mixing finely divided germanium particles in a carrier solvent having a low temperature of evaporation, uniformly applying the mixture to the surface of the oxide layer 16, and then evaporating the carrier solvent, thereby leaving a fine layer of germanium particles 17 upon the surface of the oxide layer, as observed in FIGURE 1. It is to be noted that it is not necessary that the germanium particles be directly adjacent one another as small spaces may be present between each particle. In addition, it is desirable, although not limited to this case, that the coating of germanium particles be of a single layer, as shown in FIGURE 2.

In one particular instance, germanium material was pulverized to very fine particles, mixed with an acetone solvent, the germanium particles having a concentration of about 20% by volume. The mixture was then applied with a medicine dropper to the surface of the coated slice, the slice rotated at very high speeds, and the acetone carrier evaporated at approximately room temperature, leaving a uniform coating of germanium particles upon the surface of the oxide layer 16.

Figure 2:
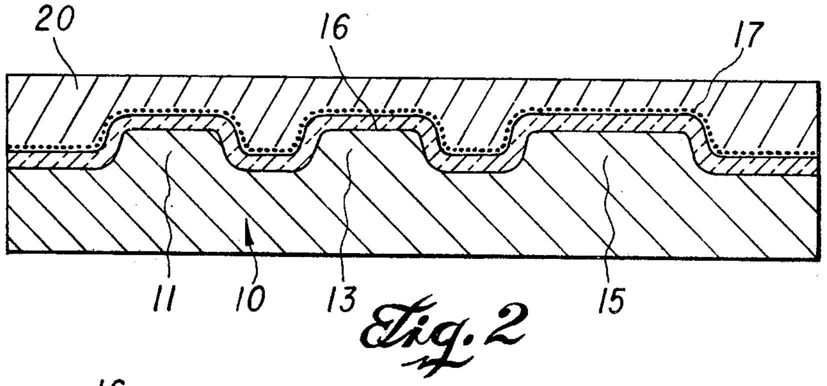
FIGURES 2 and 3 are elevational views in section of the semiconductor wafer of FIGURE 1 in successive stages of production.

As the next step, a layer 20 of poylcrystalline germanium semiconductor material is vapor deposited over the top surface of the slice 10 as seen in FIGURE 2. Any conventional technique of vapor deposition may be used, one common method being the hydrogen reduction of germanium tetrachloride. The oxide coated slice with the germanium particles 17 upon the surface of the oxide is placed in a deposition reactor, such as that shown in FIGURE 5 for example. The apparatus illustrated in FIGURE 5, comprises a furnace tube 30 having heating coils 31. Wafers 10 on a quartz boat 32 are positioned within the reactor so as to expose the wafers to gases directed into the tube through a conduit 34. A liquid halide compound of germanium semiconductor material is contained in the flask 36. In this example, germanium tetrachloride ($GeCl_4$) was used. Purified dried hydrogen ($H_2$) enters an end 35 of the conduit, a portion of the hydrogen being bubbled through the flask 36, thereby respectively introducing germanium tetrachloride and hydrogen vapors into the conduit 34 and thereafter into the tube furnace 30. The flow of the gases into the tube furnace 30 is regulated by conventional valves.

The rate of deposition is determined largely by the temperature at which the reactors are maintained, the flow rate through the conduit 34, and the percentage composition of the constituents. For example, when the flow rate was kept at approximately 15 liters per minute, the temperature at approximately 830° C., and the reactive mixture consisted of approximately 1% germanium chloride by volume, and the remaining volume percent essentially $H_2$, a layer 20 of polycrystalline germanium was deposited uniformly upon the silicon oxide substrate at a rate slightly greater than 1 milli-inch per six minutes, the germanium particles 17 providing nucleation sites for the vapor deposition. Without the coating 17 of the germanium particles, attempts to vapor deposit the layer 20 at temperatures above 600° C. when the concentration of germanium tetrachloride was approximately 1% or higher were unsuccessful.

Figure 3:
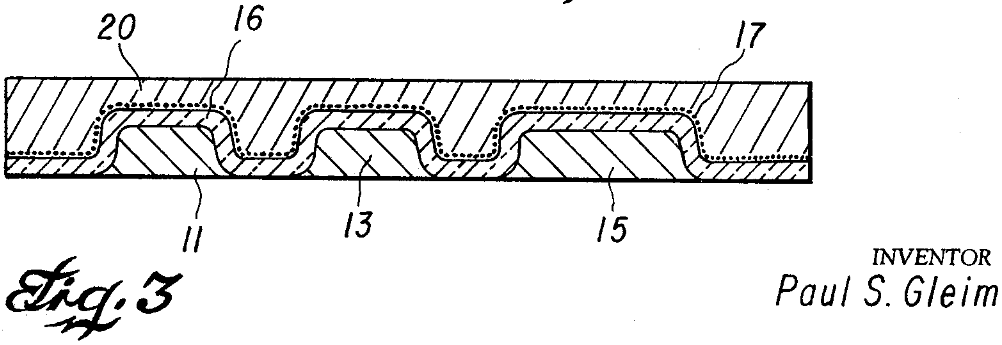
Figure 4:
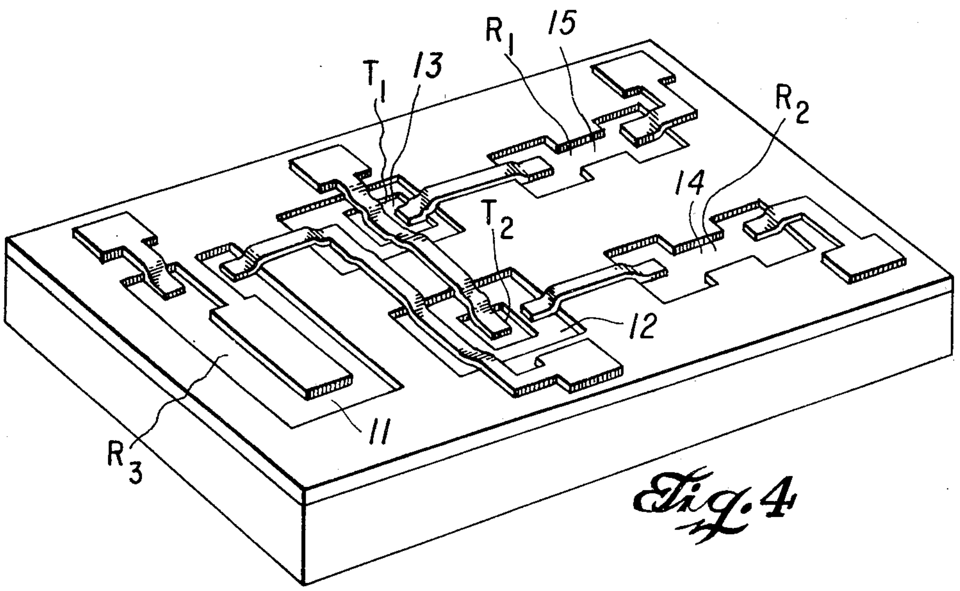
FIGURE 4 is a pictorial view of a completed integrated circuit device.

The conductivity type of the layer 20 is not critical, and thickness of the layer should be perhaps 7 or 8 mills or more to facilitate handling of the unit without breakage. The structure of FIGURE 2 is next subjected to a lapping and polishing treatment on its lower face to remove all the original monocrystalline material except that portion remaining within the mesas 11–15, as illustrated in FIGURE 3. Each of the monocrystalline portions 11–15 is insulated from the others and from the substrate or layer 20 by the silicon oxide coating 16. These monocrystalline portions then serve as regions into which diffusions may be made or epitaxial depositions carried out in order to fabricate individual circuit components within each mesa portion. The portion of a completed device is shown in FIGURE 4, wherein transistors $T_1$ and $T_2$ have been formed by diffusion into the monocrystalline pockets 13 and 12 respectively, and resistors $R_1$, $R_2$, and $R_3$ have been formed in monocrystalline portions 15, 14, and 11 respectively. Metallized contacts are shown in FIGURE 4 interconnecting the various components with each other to form a desired circuit function.

Figure 5:
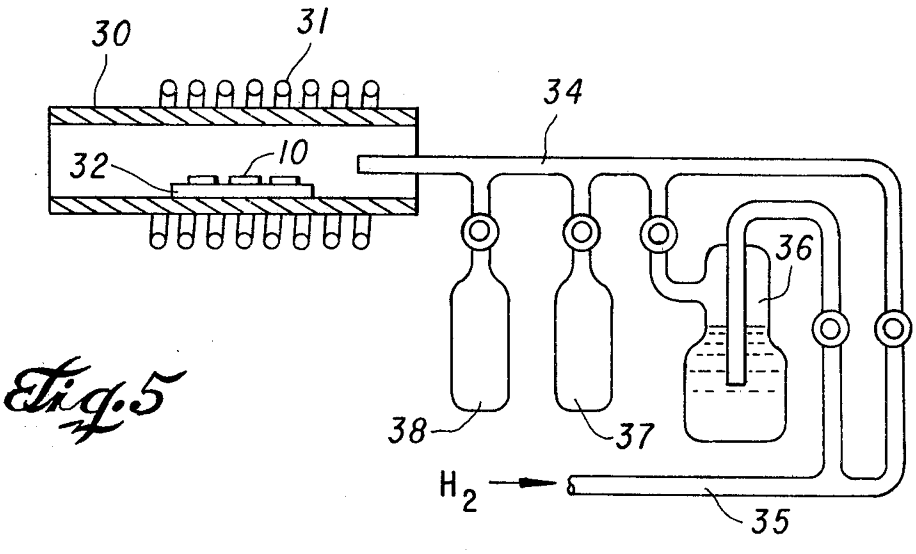
FIGURE 5 is a front elevation, partly in section, of one form of apparatus used in the process of this invention.
Figure 6:
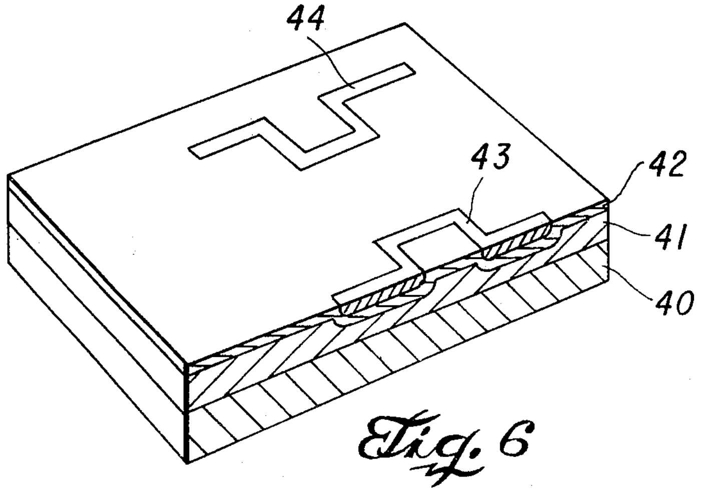
FIGURE 6 is a pictorial view in section of a semiconductor wafer in which resistive elements have been produced by the deposition of doped, polycrystalline germanium semiconductor material.
Figure 7:
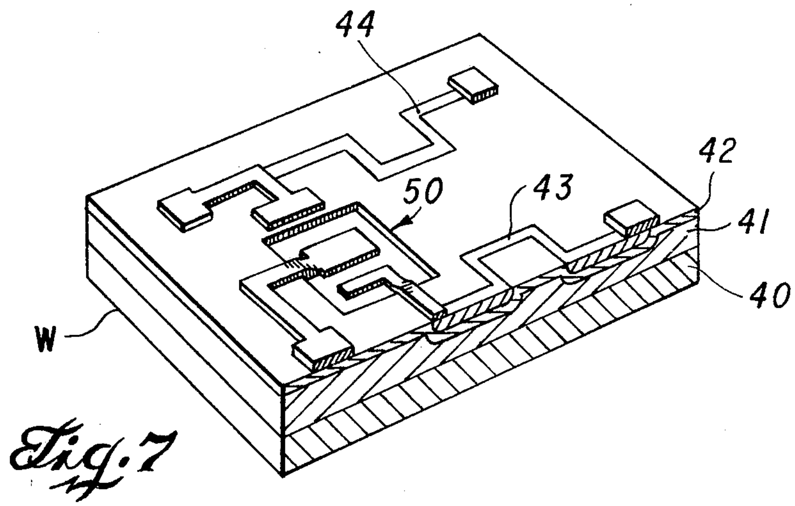
FIGURE 7 is a pictorial view in section of a semiconductor wafer having an integrated circuit therein.

The process of the invention can also be utilized to form resistive elements on a wafer as illustrated in FIGURES 6 and 7. Shown is a semiconductor substrate 40 with a epitaxial layer 41. The surface of the epitaxial layer 41 is selectively etched in a desired pattern for the resistive elements. A silicon oxide film 42, for example, is then formed on the surface to provide electrical insulation. Germanium particles are then applied, as before, to the surface of the oxide layer 42 in order to provide a nucleating surface. Next, polycrystalline germanium is deposited on the silicon oxide film 42 in the same manner as illustrated above. However, in addition to the germanium tetrachloride vapor, a dopant vapor, such as phosphine ($PH_3$) for N type doping or diborance ($P_2H_6$) for P type doping is also introduced in to the furnace. The dopant compounds can be stored in cylinders 37 and 38, as shown in FIGURE 5, with hydrogen as a carrier gas. The appropriate valves are adjusted to interject the dopant gas into the conduit 34. Thus, the polycrystalline layer will have a conductivity which is determined by the amount of dopant vapor used and the polycrystalline grain size. After depositing the doped germanium polycrystalline layer, the layer is lapped until the polycrystalline germanium remains only in the etched portions in the surface of the substrate 41, thereby completing the resistive elements 43 and 44. Alternatively, a polycrystalline germanium resistor may be made by forming the silicon oxide film 42 over the planar surface of the substrate 41, without the prior etching step, then depositing the polycrystalline germanium as before with the use of the nucleating coating, and thereafter selectively ecthing to define the resistor paths. As another alternative, the coating of germanium particles serving as the nucleating agent may be selectively located upon the surface of the silicon oxide layer 42, the polycrystalline germanium semiconductor material thereby being confined to the region defined by the nucleating coating since the polycrystalline material only vapor deposits upon this coating.

Polycrystalline resistors made in accordance with this process can be incorporated into integrated circuits, as seen in FIGURE 7. After making the polycrystalline resistor elements 43 and 44, as above described, conventional photomasking, oxide etching, and diffusion techniques can be utilized to fabricate the transistor 50 for example. Openings are then made in the oxide where contact is required, then metal film is deposited over the oxide and selectively removed to provide the desired contacts and interconnections, as shown in FIGURE 7.

Although the preceding embodiments have described the invention with reference to the vapor deposition of polycrystalline germanium semiconductor material upon a silicon oxide substrate, the invention may be utilized whenever germanium semiconductor material is to be deposited upon *any* dissimilar substrate surface. Various other modifications of the disclosed embodiments, as well as other embodiments of the invention, may become apparent to persons skilled in the art without departing from the spirit and scope of the invention as defined by the appended claims.

What is claimed is:

1. A method for fabricating individual circuit components within a semiconductor body, said components being electrically isolated from each other through the body, comprising the steps of:

(a) forming a plurality of mesa regions upon a wafer of semiconductor material, (b) forming a layer of insulating medium over each of said mesa regions, (c) applying a slurry containing germanium particles in an evaporable carrier to said layer of insulating medium, (d) evaporating said carrier so as to apply a coating of randomly oriented germanium particles to said layer of insulating medium, (e) vapor depositing a body of polycrystalline germanium semiconductor material upon said germanium particles and said layer of insulating medium, thereby to completely cover the layer of said insulating medium and said germanium particles, said germanium particles acting as nucleating sites for said vapor depositing, (f) removing substantially all of the semiconductor material of said wafer except the portion which forms the mesa regions, and (g) forming individual circuit components within said mesa regions.

2. The method as described in claim 1 wherein said insulating medium is an oxide of silicon.

3. The method as described in claim 1 wherein said vapor depositing is by reacting germanium tetrachloride with hydrogen gas at elevated temperatures.

4. The method as described in claim 3 wherein the concentration of germanium tetrachloride is at least 1% by volume and the reactive temperature is in excess of 600° C.

5. A semiconductor network comprising:

a body of polycrystalline germanium semiconductor material having a plurality of pockets distributed in a surface thereof;

a layer of electrical insulating material within each pocket, said layer coating the entire surface within each pocket of said polycrystalline germanium semiconductor material;

a plurality of substantially coplanar monocrystalline semiconductor regions disposed within said pockets and separated from said polycrystalline germanium by means of said electrical insulating material;

at least one circuit component within each of said plurality of monocrystalline germanium regions; and metallized contacts interconnecting said components to form a circuit.

6. The structure as described in claim 5 wherein said continuous layer is an oxide of silicon.

References Cited

UNITED STATES PATENTS

| | | | |
|---|---|---|---|
| 2,692,839 | 10/1954 | Christensen et al. | 117—106 X |
| 3,160,521 | 12/1964 | Ziegler et al. | 117—106 X |
| 3,172,778 | 3/1965 | Gunther et al. | 117—106 X |

WILLIAM L. JARVIS, Primary Examiner

U.S. Cl. X.R.

29—529, 576; 117—213, 107, 66, 120; 317—235